(12) United States Patent
Eastoe et al.

(10) Patent No.: US 10,240,425 B2
(45) Date of Patent: Mar. 26, 2019

(54) CONNECTION ASSEMBLY, SENSOR ASSEMBLY AND SUBSEA CABLE HARNESS

(71) Applicant: Siemens Aktiengesellschaft, Munich (DE)

(72) Inventors: Andrew Robert Eastoe, Urangsvaeg (NO); Kjetil Haldorsen, Rubbestadneset (NO)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 0 days.

(21) Appl. No.: 15/776,125

(22) PCT Filed: May 23, 2016

(86) PCT No.: PCT/EP2016/061566
§ 371 (c)(1),
(2) Date: May 15, 2018

(87) PCT Pub. No.: WO2017/084768
PCT Pub. Date: May 26, 2017

(65) Prior Publication Data
US 2018/0340392 A1    Nov. 29, 2018

(30) Foreign Application Priority Data
Nov. 17, 2015  (EP) .................... 15194951

(51) Int. Cl.
*H01R 13/52* (2006.01)
*E21B 33/038* (2006.01)
(Continued)

(52) U.S. Cl.
CPC ..... *E21B 33/0385* (2013.01); *H01R 13/6683* (2013.01); *H02G 15/14* (2013.01);
(Continued)

(58) Field of Classification Search
CPC ............. H01R 13/5219; H01R 13/53; H01R 13/5202; H01R 13/5208
(Continued)

(56) References Cited

U.S. PATENT DOCUMENTS 4,689,440 A    8/1987  Morin
5,199,893 A *  4/1993  Fussell ................. G01V 1/201
                                                    439/271
(Continued)

FOREIGN PATENT DOCUMENTS

EP      0592782 A2      4/1994
JP      H11121086 A     4/1999
WO      WO-2013172846 A1  11/2013

OTHER PUBLICATIONS

Written Opinion of the International Preliminary Examining Authority (PCT/IPEA/408) for International Application No. PCT/EP2016/061566 filed May 23, 2016.
(Continued)

*Primary Examiner* — Phuong Chi T Nguyen
(74) *Attorney, Agent, or Firm* — Harness, Dickey & Pierce, P.L.C.

(57) ABSTRACT

A connection assembly connects at least two subsea cables to a dual output subsea sensor An embodiment includes an adapter piece mounted to a rear part of the subsea sensor; a sensor port in the adapter piece, through which at least a first sensor connection and a second sensor connection are led to the subsea sensor; a first and second port for respectively providing a connection to a first and second subsea cable; a first penetrator providing a liquid tight seal between an interior space of the adapter piece and a duct connected to the first port; and a second penetrator providing a liquid tight seal between the interior space of the adapter piece and a duct connected to the second port. The sealing provided by the first and second penetrator preventing fluid communi-
(Continued)

cation between the respective duct connected to the first and second port, through the adapter piece.

30 Claims, 4 Drawing Sheets

(51) Int. Cl.
*H02G 15/14* (2006.01)
*H02G 15/22* (2006.01)
*H01R 13/66* (2006.01)
*H02G 15/00* (2006.01)
*G01R 1/04* (2006.01)
*H01R 13/533* (2006.01)
*G01D 11/24* (2006.01)

(52) U.S. Cl.
CPC ........... *H02G 15/22* (2013.01); *G01D 11/245* (2013.01); *G01R 1/0408* (2013.01); *H01R 13/5216* (2013.01); *H01R 13/533* (2013.01); *H02G 15/003* (2013.01)

(58) Field of Classification Search
USPC ........ 439/282, 281, 271, 272, 273, 274, 275
See application file for complete search history.

(56) References Cited

U.S. PATENT DOCUMENTS

| 5,297,974 | A | * | 3/1994 | Fussell | H01R 13/5221 |
| | | | | | 439/310 |
| 5,362,258 | A | * | 11/1994 | Arnswald | H01R 13/521 |
| | | | | | 439/271 |
| 5,605,468 | A | | 2/1997 | Wood | |
| 6,716,063 | B1 | * | 4/2004 | Bryant | H01R 13/5208 |
| | | | | | 439/589 |
| 8,100,715 | B2 | * | 1/2012 | Whitlock | H01R 24/38 |
| | | | | | 439/580 |

OTHER PUBLICATIONS

Notification of Transmittal of the International Preliminary Report on Patentability (PCT/IPEA/416) for International Application No. PCT/EP2016/061566 filed May 23, 2016.

International Preliminary Report on Patentability (PCT/IPEA/409) for International Application No. PCT/EP2016/061566 filed May 23, 2016.

* cited by examiner

CONNECTION ASSEMBLY, SENSOR ASSEMBLY AND SUBSEA CABLE HARNESS

PRIORITY STATEMENT

This application is the national phase under 35 U.S.C. § 371 of PCT International Application No. PCT/EP2016/061566 which has an International filing date of May 23, 2016, which designated the United States of America and which claims priority to European patent application number EP15194951.8 filed Nov. 17, 2015, the entire contents of which are hereby incorporated herein by reference.

FIELD

An embodiment of the invention generally relates to a connection assembly, sensor assembly and/or subsea cable harness for subsea use.

BACKGROUND

Subsea pressure and temperature sensors are known and are for example used to measure pressure or temperature at different locations on a subsea hydrocarbon production or processing facility, for example on a subsea Christmas tree or in a subsea flow line.

Conventional systems employ for example a single pressure sensor to which a single cable is connected. The cable provides data communication and power to the sensor. The sensor can for example be connected to a subsea control module.

U.S. Pat. No. 4,689,440 discloses a gas pressurized coaxial cable and termination fitting assembly in which a shroud of the fitting is sealed to the jacket and extends beyond the jacket to surround an end portion of a coaxial conductor assembly.

EP 0 592 782 A2 discloses an end closure for a three-conductor high voltage current pressure cable. In the end closure two cables are pressure-tight conducted through a first connecting plate and through a second connecting plate in a respective cable lead-through.

WO 2013/172846 A1 discloses a flameproof feed-through which includes a feed-through element comprising a substantially planar shape, a first interface region, and a second interface region, wherein one or more conductors extend between the first interface region and the second interface region.

For reasons of achieving a safe and secure operation, two such pressure sensors can be provided to achieve redundancy.

SUMMARY

The inventors have recognized that the problem with such configurations is that they require a significant amount of space since each pressure sensor needs to be mounted on a different position on the flow line or on the Christmas tree. Further, such configurations are costly.

Accordingly, the inventors have recognized that there is a need for improving measurements in a subsea application.

Embodiments of the invention are described in the claims.

According to an embodiment, a connection assembly for connecting at least two subsea cables, in particular oil-filled hoses, to a dual output subsea sensor is provided.

According to an embodiment, the connection assembly comprises:

an adapter piece configured to be mounted to a rear part of the subsea sensor, a sensor port in the adapter piece through which at least a first sensor connection and a second sensor connection are led to the dual output subsea sensor, a first port for providing a connection to a first subsea cable of the subsea cables, a second port for providing a connection to a second subsea cable of the subsea cables, a first penetrator arranged in the first port, wherein the first penetrator provides a liquid tight seal between an interior space of the adapter piece and a duct connected to the first port, and wherein the first penetrator leads the first sensor connection through the first port, and a second penetrator arranged in the second port, wherein the second penetrator provides a liquid tight seal between the interior space of the adapter piece and a duct connected to the second port, and wherein the second penetrator leads the second sensor connection through the second port.

According to another embodiment, a sensor assembly is provided. The sensor assembly comprises the dual output subsea sensor and a connection assembly of at least one embodiment. The connection assembly is mounted to the subsea sensor. For example, the subsea sensor is mounted at the sensor port of the connection assembly.

According to another embodiment, a subsea cable harness is provided. The subsea cable harness comprises a first subsea cable including electrical conductors for providing a first sensor connection, a second subsea cable including electrical conductors for providing a second sensor connection, and a connection assembly of at least one embodiment. The first subsea cable is connected, directly or indirectly, to the first port of the connection assembly, and the second cable is connected, directly or indirectly, to the second port of the connection assembly. The first penetrator leads electrical conductors of the first sensor connection through the first port into an interior space of the adapter piece. The second penetrator leads electrical conductors of the second sensor connection through the second port into an interior space of the adapter piece. An indirect connection between the first subsea cable or second subsea cable and the first port or second port, respectively, may be provided by the above described mechanical interface and/or the first and second connection adapters, respectively. Additionally, a fitting, for example an MKII fitting, may be provided for indirectly connecting the first and/or second subsea cable to the corresponding port.

DETAILED DESCRIPTION OF EXAMPLE EMBODIMENTS

Figure 1:
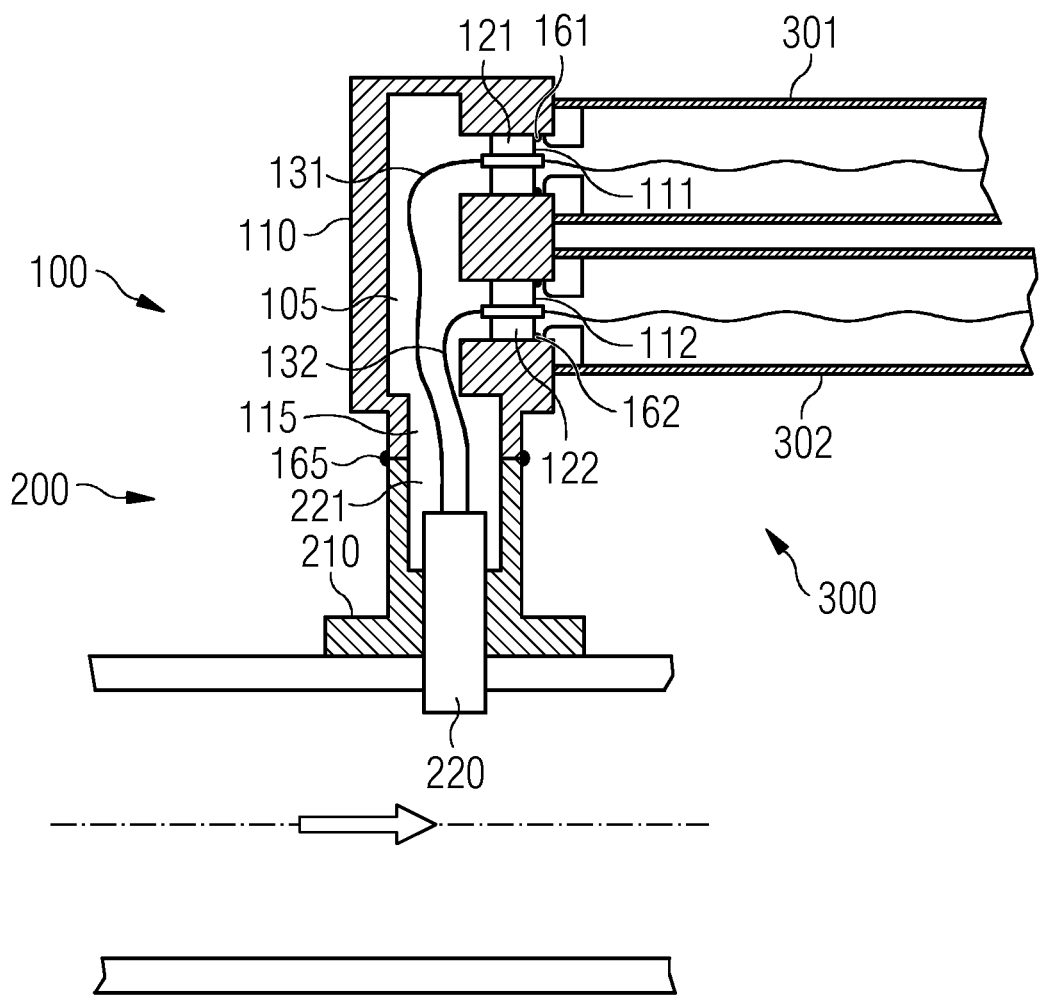
FIG. 1 shows a sectional side view of a sensor assembly, a connection assembly and a subsea cable harness according to an embodiment of the invention.

According to an embodiment, a connection assembly for connecting at least two subsea cables, in particular oil-filled hoses, to a dual output subsea sensor is provided.

According to an embodiment, the connection assembly comprises:
- an adapter piece configured to be mounted to a rear part of the subsea sensor,
- a sensor port in the adapter piece through which at least a first sensor connection and a second sensor connection are led to the dual output subsea sensor,
- a first port for providing a connection to a first subsea cable of the subsea cables,
- a second port for providing a connection to a second subsea cable of the subsea cables,
- a first penetrator arranged in the first port, wherein the first penetrator provides a liquid tight seal between an interior space of the adapter piece and a duct connected to the first port, and wherein the first penetrator leads the first sensor connection through the first port, and
- a second penetrator arranged in the second port, wherein the second penetrator provides a liquid tight seal between the interior space of the adapter piece and a duct connected to the second port, and wherein the second penetrator leads the second sensor connection through the second port.

The sealing provided by the first penetrator and by the second penetrator is such that there is no fluid communication between the duct connected to the first port and the duct connected to the second port through the adapter piece.

Such configuration requires only relatively little space since it becomes possible to employ a dual output subsea sensor and to connect two subsea cables to such sensor. In particular, oil-filled hoses can be used in such configuration, which has the advantage that the assembly can be installed at large water depths, for example in excess of 1,000 m. Since two separate penetrators are provided for the first and second ports towards which the subsea cables are connected, an oil volume in the first subsea cable can be kept isolated from an oil volume of the second subsea cable. Accordingly, when one subsea cable is damaged so that water leaks into the subsea cable, the other subsea cable remains unaffected and operation of the subsea sensor can continue.

According to an embodiment, the first penetrator and/or the second penetrator comprise a penetrator body made of metal. The metal penetrator body may resist a large pressure difference between for example a pressure in the duct connected to the first port or second port and the interior of the adapter piece.

For example, the adapter piece may be configured to maintain a predefined interior pressure below 5 bar, preferably below 1.5 bar when deployed in a subsea environment. However, in subsea environment the pressure in the duct connected to the first port or second port may be some hundred bar, for example 300 bar in a depth of 3000 m.

According to another embodiment, the first penetrator is sealed in the first port by a weld. Additionally or as an alternative, the second penetrator is sealed in the second port by a weld. By welding the first penetrator and/or second penetrator to the corresponding first port and second port, respectively, a reliable sealing between the penetrators and the ports may be achieved which may resist the above-described high pressure difference between a pressure in the duct connected to the first port or second port and the interior of the adapter piece.

In particular, the first and second penetrators may each comprise a corresponding penetrator body having one or more through-holes for leading the first sensor connection and the second sensor connection through the first penetrator and the second penetrator, respectively. The one or more through-holes may be filled with a glass material and may thus provide a glass-to-metal seal sealing the sensor connections within the through-holes of the penetrators. The glass-to-metal seal provides a high resistance against the pressure difference between the pressure in the interior space of the adapter piece and the pressure in the duct connected to the first and second ports. Furthermore, the glass-to-metal seal electrically isolates the sensor connections from the metal penetrator body.

According to another embodiment, the first port and/or the second port provides a mechanical interface for the connection of a subsea cable, for example an oil-filled hose, in particular for the connection of an MKII fitting of an oil-filled hose. By providing a mechanical interface for the connection of an oil-filled hose, in particular a mechanical interface for the connection of the well-known MKII fitting, the connection assembly may be easily integrated into existing and new subsea constructions.

Furthermore, the connection assembly may comprise a first connection adapter mounted to the first port or mounted to the adapter piece and providing the first port. For example, the first connection adapter may provide a receptacle for receiving a connector provided at the duct to be coupled to the first port. In other words, the connection adapter may provide a mechanical interface for connecting a duct provided with a specific connector, for example an MKII fitting of an oil-filled hose. Other kinds of the first connection adapter may provide a mechanical interface for connecting to other connector types or for directly connecting to a subsea cable. This enables a support of a large variety of connection schemes. Likewise, the connection assembly may comprise a second connection adapter mounted to the second port or mounted to the adapter piece and providing the second port.

The first and/or second connection adapter may be sealed to the respective port via at least two O-ring seals. This may enable a reliable sealing between the first and/or second connection adapter and the respective first or second port.

The first and/or second connection adapter may be filled with dielectric liquid, in particular an oil. The first and/or second connection adapter may be filled with the same dielectric liquid as the duct connected to the corresponding first and second connection adapter, and a fluid connection between the dielectric liquid in the duct and the dielectric liquid in the corresponding first and second connection adapter may be provided. However, the first and second penetrators provide a separation between the interior space of the adapter piece and the dielectric liquid filling the duct and the corresponding first and second connection adapter.

According to another embodiment, the sensor port comprises a mechanical interface for mounting the adapter piece to a mounting flange or sensor housing of the subsea sensor. For example, the subsea sensor is mounted to the mounting flange and the adapter piece is welded to the mounting flange. Thus, a fluid tight and pressure resistive connection between the mounting flange and the adapter piece may be provided.

According to another embodiment, the connection assembly comprises a mounting flange for mounting the subsea sensor. An interior space of the mounting flange, in which the subsea sensor is disposed, and an interior space of the adapter piece are in fluid communication. The interior space of the mounting flange and the interior space of the adapter piece may be filled with gas, for example dried nitrogen gas.

In particular, the adapter piece may be configured to maintain a predefined interior pressure, for example a pressure below 5 bar, preferably below 1.5 bar when being deployed in a subsea environment. This enables an operation of electrical and electronic components which are not designed for an operation under subsea high pressure conditions of for example a few hundred bar.

According to another embodiment, the adapter piece is extending along an axial direction and the sensor port is provided on an end face of the adapter piece. The end face is perpendicular to the axial direction. The first and second ports are provided on the lateral surface of the adapter piece. The lateral surface is substantially parallel to the axial direction. Thus, a plurality of ports may be arranged at the adapter piece. For example, the first port and the second port may be provided on substantially opposite lateral surfaces of the adapter piece. Additionally or as an alternative, the ports may be arranged in a row along the lateral surface of the adapter piece in the axial direction.

According to an embodiment, the first sensor connection and/or the second sensor connection comprises at least two electrical conductors for data transmission and preferably furthermore two electrical conductors for power transmission. Thus, a redundant data transmission and a redundant power transmission can be provided.

According to another embodiment, a sensor assembly is provided. The sensor assembly comprises the dual output subsea sensor and a connection assembly of at least one embodiment. The connection assembly is mounted to the subsea sensor. For example, the subsea sensor is mounted at the sensor port of the connection assembly.

According to an embodiment, the dual output subsea sensor comprises at least two pressure sensing elements and/or at least two temperature sensing elements. The output of the respective sensitive elements is communicated on the first and second sensor connections. By providing at least two pressure sensing elements and two the temperature sensing elements, a completely independent and redundant pressure and temperature measurement and determination via two connected subsea cables is enabled.

According to another embodiment, a subsea cable harness is provided. The subsea cable harness comprises a first subsea cable including electrical conductors for providing a first sensor connection, a second subsea cable including electrical conductors for providing a second sensor connection, and a connection assembly of at least one embodiment. The first subsea cable is connected, directly or indirectly, to the first port of the connection assembly, and the second cable is connected, directly or indirectly, to the second port of the connection assembly. The first penetrator leads electrical conductors of the first sensor connection through the first port into an interior space of the adapter piece. The second penetrator leads electrical conductors of the second sensor connection through the second port into an interior space of the adapter piece. An indirect connection between the first subsea cable or second subsea cable and the first port or second port, respectively, may be provided by the above described mechanical interface and/or the first and second connection adapters, respectively. Additionally, a fitting, for example an MKII fitting, may be provided for indirectly connecting the first and/or second subsea cable to the corresponding port.

The first subsea cable and/or the second subsea cable may comprise a corresponding oil-filled hose. Furthermore, the subsea cable harness may comprise the sensor assembly described above.

Thus, similar advantages as described above in connection with the connection assembly are achieved by the sensor assembly and the subsea cable harness.

Although specific features are described in the above summary and the following detailed description in connection with specific embodiments, it is to be understood that the features of the different embodiments of the invention can be combined with each other unless noted to the contrary.

In the following, example embodiments of the invention will be described in more detail. It is to be understood that the features of the various example embodiments described herein may be combined with each other unless specifically noted otherwise. Same reference signs in the various drawings refer to similar or identical components.

FIG. 1 shows a subsea cable harness 300 comprising a sensor assembly 200 connected to a first subsea cable 301 and a second subsea cable 302. The sensor assembly 200 comprises a subsea sensor 220 and a connection assembly 100. The subsea sensor 220 is mounted to a mounting flange 210 of the connection assembly 100.

The connection assembly 100 includes an adapter piece 110 that has a first port 111, a second port 112 and a sensor port 115. The adapter piece 110 is mounted to a rear part of the subsea sensor 220. For example, as shown in FIG. 1, the adapter piece 100 is mounted to the rear part of the subsea sensor 220 via the mounting flange 210. The mounting flange 210 may be coupled to a subsea flow line or subsea Christmas tree in which a pressure and temperature of a fluid therein is to be detected and monitored.

In the first port 111, a first penetrator 121 is provided and sealed. In the second port 112, a second penetrator 122 is provided and sealed.

The bodies of penetrators 121, 122 are made of a metal. Sealing between the penetrators 121, 122 and the adapter piece 110 may be done via a weld 161 and 162, respectively. The adapter piece 110 is made of metal, in particular stainless steel.

Figure 4:
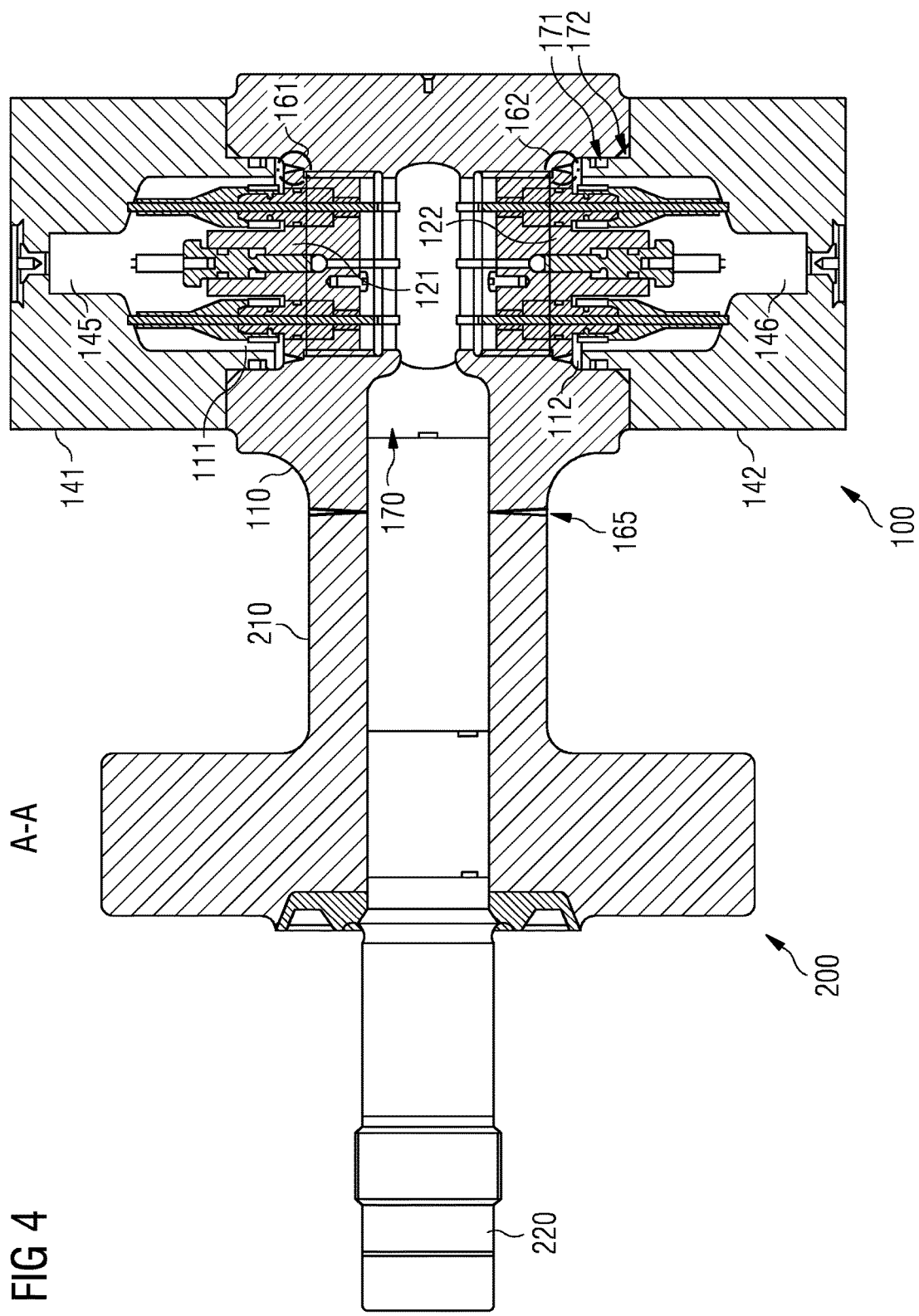
FIG. 4 shows a sectional view along the line A-A of the connection assembly and the sensor assembly of FIG. 2.

The first subsea cable 301 in form of an oil-filled hose is connected to the first port 111. It is to be noted that this connection can also be an indirect connection via a connection adapter 141 as shown in FIG. 4. The second subsea cable 302 in form of an oil-filled hose is connected to the second port 112. It is to be noted that this connection can also be an indirect connection via a connection adapter 142 as shown in FIG. 4.

The connection assembly 100 may, for example, comprise two such connection adapters 141, 142 that are mounted to the first and second ports, respectively, for providing a mechanical interface for mounting the respective subsea cable. In other configurations, such connection adapters 141, 142 may provide the first and/or second ports 111, 112, and the first and/or second penetrators 121, 122 may be provided in such connection adapters.

An oil-filled hose has a flexible outer jacket that is filled with oil and in which respective lines are disposed, such as power lines and/or data lines. Due to the flexibility and the oil filling, the internal pressure in such hose is balanced to the outside water pressure while the liquid filling prevents a collapsing of the hose.

Via the first and second penetrators 121, 122, it is ensured that the oil volumes of the two oil-filled hoses 301, 302 are kept separate and are kept separate from the interior space 105 of the adapter piece 110. Accordingly, if one hose leaks, the other hose and the interior space 105 of the adapter piece 110 are not affected.

The subsea sensor 220 is a dual output subsea sensor that gives out at least two measurements taken by two sensor elements. The sensor 220 may comprise two pressure sensor elements for two independent pressure measurements. The sensor 220 may comprise two temperature sensor elements for two independent temperature measurements. Preferably, it comprises both, two pressure sensor elements and two temperature sensor elements.

Processed or raw sensor readings are given out on the first sensor connection 131 for a first pressure sensor element and a first temperature sensor element, and on the second sensor connection 132 for a second pressure sensor element and a second temperature sensor element of subsea sensor 220. In other words, information concerning pressure and temperature detected at the sensor elements are output separately via corresponding sensor connections. For example, information concerning the pressure and temperature detected at the first pressure and temperature sensing elements may be output via the first sensor connection 131, and information concerning the pressure and temperature detected at the second pressure and temperature sensing elements may be output via the second sensor connection 132.

The first and second penetrators 121, 122 lead the first and second sensor connections 131, 132 from an interior space 105 of the adapter piece 110 into a duct that is in fluid communication with the interior of the respective oil-filled hose. The duct can be provided by the respective port, the above mentioned connection adapter 141, 142 or the oil filled hose 301, 302—the duct is essentially a volume on the other side of the respective penetrator 121, 122 into which the respective sensor connection 131, 132 is led by the respective penetrator 121, 122.

Preferably, the first and second sensor connections 131, 132 each comprise two electrical data lines and two power lines for supplying electrical power to the respective sensor element(s). Each sensor connection 131, 132 may comprise for example one or more electrical wires.

In the example of FIG. 1, the adapter piece 110 is mounted to the mounting flange 210. The mounting flange 210 is mounted to the equipment at which the sensor reading is to be taken, for example a flow line in FIG. 1. The mounting flange 210 can form a part of the connection assembly 100.

In the example of FIG. 1, the adapter piece 110 is mounted to the mounting flange 210 via a weld 165. As can be seen, a volume 221 at the rear side of the sensor 220 within the mounting flange 210 is in flow communication with the interior space 105 inside the adapter piece 110. Accordingly, medium can flow between the volumes 221, 105. Preferably, these volumes 221, 105 are filled with a gas, such as dried nitrogen.

The connection assembly 100 may be adapted to maintain a predefined pressure inside the volumes 221, 105 when installed subsea, for example a close to atmospheric pressure, e.g. a pressure below 5 bar or below 1.5 bar.

For example, (not shown) electrical or electronic components for processing sensor data may be provided within the volumes 221, 105. Due to the predefined pressure, which may be much lower than ambient pressure in subsea conditions, the electrical or electronic components may be designed for these lower pressures and need not to be pressure resistant to high pressures in subsea environments.

For example, in volume 221 electronic cards for transmitting and/or processing sensor readings may be disposed, or they may be disposed in a rear part of sensor 220.

Figure 2:
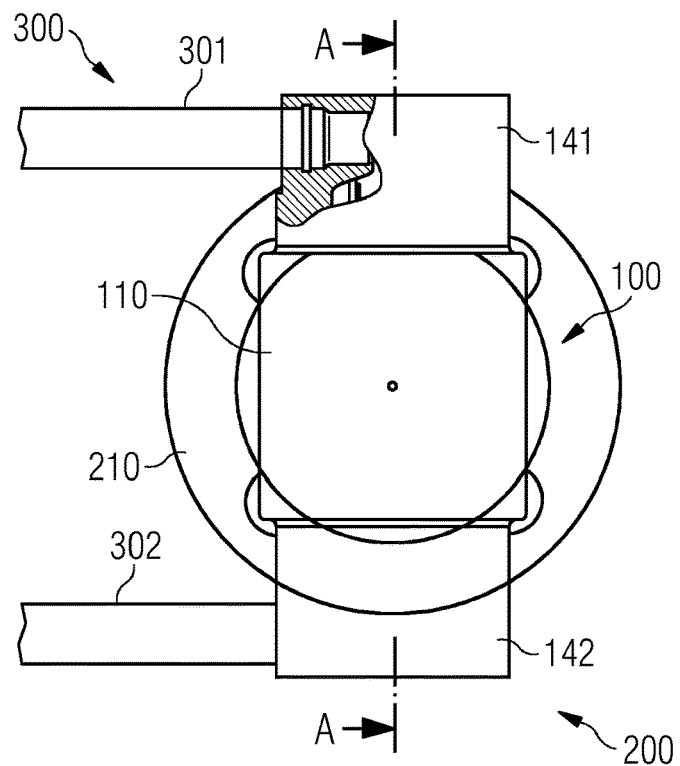
FIG. 2 shows a front view of a connection assembly and a sensor assembly according to an embodiment.

FIG. 2 shows a front view of the sensor assembly 200 including the connection assembly 100 according to a further embodiment. Accordingly, the above explanations also apply to the embodiment of FIG. 2. In FIG. 2, the subsea cables 301, 302 in the form of oil-filled hoses are mounted to the first and second ports 111, 112 (see also FIG. 4) via the connection adapters 141, 142. In the example of FIG. 2, the adapter piece 110 is extending along an axial direction perpendicular to the drawing plane of FIG. 2. The sensor port 115 is provided at an end face of the adapter piece 110 that is perpendicular to the axial direction, i.e. in the drawing plane of FIG. 2. The first and second ports are provided on a lateral surface of the adapter piece 110. The lateral surface is substantially parallel to the axial direction. The first port and the second port are provided on substantially opposite lateral surfaces of the adapter piece 110. For connecting the subsea cables 301 and 302, at each port a corresponding connection adapter 141 and 142 is provided. Connection adapter 141 may be sealed to its corresponding port via at least two O-ring seals. Likewise, connection adapter 142 may be sealed to its corresponding port via at least two O-ring seals.

The connection adapters 141 and 142 provide a receptacle for receiving a fitting at the end of the corresponding subsea cable 301, 302. For example, a receptacle for receiving an MKII fitting may be provided at each of the connection adapters 141, 142. Corresponding MKII fittings may be provided at the end of each of the subsea cables 301, 302.

Figure 3:
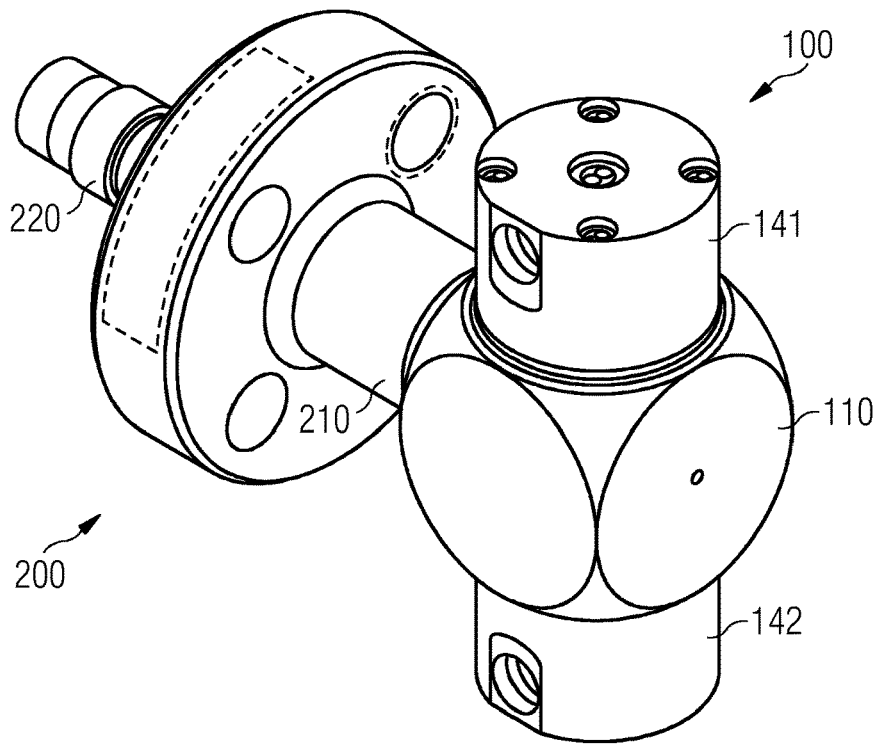
FIG. 3 shows a perspective view of the connection assembly and the sensor assembly of FIG. 2.

FIG. 3 shows a perspective view of the sensor assembly 200 including the connection assembly 100 of FIG. 2, and these can form part of embodiments of the subsea cable harness 300.

FIG. 4 shows a sectional view of the sensor assembly 200 of FIG. 2 taken along the line A-A. The sensor assembly 200 comprises the subsea sensor 220 and the connection assembly 100. The subsea sensor 220 is mounted at the mounting flange 210 of the connection assembly 100. The mounting flange 210 is coupled by a weld 165 to the adapter piece 110. The adapter piece 110 provides two ports, the first port 111 and the second port 112. In the first port 111 a first penetrator 121 is arranged. The first penetrator 121 is made of metal and sealed in the first port 111 by a weld 161. In the second port 112 a second penetrator 122 is arranged. The second penetrator 122 is made of metal and sealed in the second port 112 by a weld 162. Thus, an interior space within the adapter piece 110 extending from the first and second penetrators 121, 122 to the subsea sensor 220 is completely isolated from an exterior and may be filled with gas, for example dried nitrogen 170.

Connection adapters 141, 142 are provided in the ports 121, 122, respectively. Ducts 145, 146 are provided by the connection adapters 141, 142 and may extend into the oil-filled hoses 301 and 302, which are not shown in FIG. 4. When connected to the oil-filled hoses 301, 302, the ducts 145, 146 may also be filled with liquid or oil. The liquid-filled interior space of the connection adapters 141, 142, which provide the ducts 145, 146, is visible in FIG. 4.

The connection adapters 141, 142 may provide receptacles for receiving fittings, for example MKII fittings. The connection adapters 141, 142 may be sealed to the respective port 111, 112 via two O-ring seals 171, 172.

Figure 5:
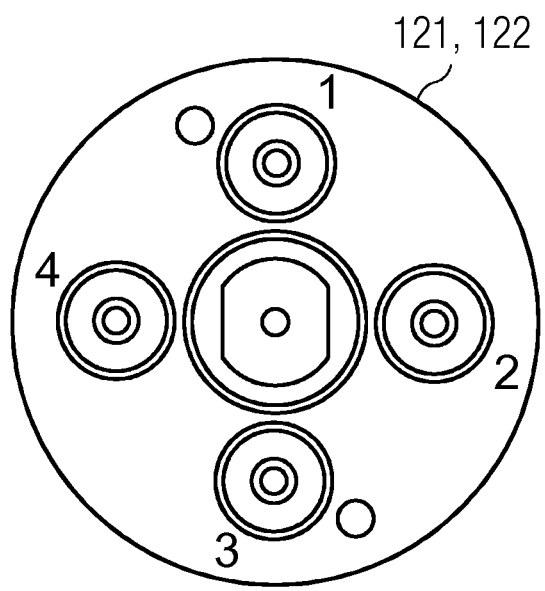
FIG. 5 shows a front view of a penetrator that can be used in embodiments of the invention.

FIG. 5 shows a front view of the first or second penetrator 121, 122, which may be configured similarly, with example through-connections. The penetrator 121, 122 comprises a penetrator body having one or more through-holes for leading connections through the penetrator. The penetrator body is made of metal.

In the example shown in FIG. 5 the penetrator body has four through-holes for leading connections 1 to 4 through the penetrator. Connections 1 and 2 provide electrical power as part of the first or second sensor connection 131, 132, and connections 3 and 4 provide data communication as part of the first or second sensor connection 131, 132. Data communication may for example occur via a differential serial bus, such as CAN (controller area network). Each through-hole may be filled with a glass material and may thus be sealed by a glass-to-metal seal. In detail, a connection 1-4 extending through the through-hole is completely and continuously surrounded by the glass material. The glass material is also continuously in contact with an inner wall of the through-hole.

The glass-to-metal sealing of the connections in the through-holes 1-4 of the penetrator body provides a reliable sealing at high pressure differences. Further, the metal penetrator body may be welded to the corresponding port thus providing a reliable sealing even at high pressure differences which may exist between the oil-filled duct 145, 146 and the interior space 105 of the adapter piece 110.

The invention is not limited to the example embodiments described in the foregoing. Rather, other variants of the invention may also be derived herefrom by the person skilled in the art without departing from the subject matter of the invention.

The invention claimed is:

1. A connection assembly for connecting at least two subsea cables to a dual output subsea sensor, the connection assembly comprising:
   an adapter piece, to be mounted to a rear part of the subsea sensor,
   a sensor port being located in the adapter piece, through which at least a first sensor connection and a second sensor connection are led to the dual output subsea sensor;
   a first port, to provide a connection to a first subsea cable of the at least two subsea cables;
   a second port, to provide a connection to a second subsea cable of the at least two subsea cables;
   a first penetrator, arranged in the first port, to provide a liquid tight seal between an interior space of the adapter piece and a duct connected to the first port, the first penetrator being further configured to lead the first sensor connection through the first port; and
   a second penetrator, arranged in the second port, to provide a liquid tight seal between the interior space of the adapter piece and a duct connected to the second port, the second penetrator being further configured to lead the second sensor connection through the second port,
   wherein the liquid tight seal, provided by each of the first penetrator and the second penetrator, is configured to prevent fluid communication between the respective duct connected to the first port and the respective duct connected to the second port through the adapter piece,
   wherein at least one of
      the first penetrator is sealed in the first port by a weld, and
      the second penetrator is sealed in the second port by a weld.

2. The connection assembly of claim 1, wherein at least one of the first port and the second port provides a mechanical interface to provide a connection to an MKII fitting of a corresponding at least one of the first subsea cable and second subsea cable.

3. The connection assembly of claim 1, wherein at least one of the duct connected to the first port and the duct connected to the second port is filled with a dielectric liquid so that at least one of the first and second penetrators provide separation between the interior space of the adapter piece and the dielectric liquid filling the respective at least one of the duct connected to the first port and the duct connected to the second port.

4. The connection assembly of claim 1, wherein the sensor port comprises a mechanical interface to mount the adapter piece to a mounting flange or sensor housing of the subsea sensor.

5. The connection assembly of claim 1, further comprising:
   a mounting flange to mount the subsea sensor, wherein the adapter piece is welded to the mounting flange.

6. The connection assembly of claim 1, further comprising:
   a mounting flange to mount the subsea sensor, wherein an interior space of the mounting flange, in which the subsea sensor is disposed, and the interior space of the adapter piece are in fluid communication and are filled with gas.

7. The connection assembly of claim 1, wherein at least one of the first penetrator and the second penetrator includes a penetrator body made of metal.

8. The connection assembly of claim 7, wherein at least one of the first penetrator and the second penetrator includes a penetrator body having one or more through-holes to lead the first sensor connection or the second sensor connection through the first penetrator or the second penetrator, respectively, and wherein the one or more through-holes are filled with a glass material and are sealed by a glass-to-metal seal.

9. The connection assembly of claim 1, wherein at least one of the first penetrator and the second penetrator includes a penetrator body having one or more through-holes to lead the first sensor connection or the second sensor connection through the first penetrator or the second penetrator, respectively, and wherein the one or more through-holes are filled with a glass material and are sealed by a glass-to-metal seal.

10. The connection assembly of claim 9, wherein at least one of the first port and the second port provides a mechanical interface to provide a connection to an MKII fitting of a corresponding at least one of the first subsea cable and second subsea cable.

11. The connection assembly of claim 1, wherein the adapter piece is configured to extend along an axial direction, wherein the sensor port is provided on an end face of the adapter piece that is perpendicular to the axial direction, and wherein the first port and the second port are provided on a lateral surface of the adapter piece that is substantially parallel to the axial direction.

12. The connection assembly of claim 11, wherein the first port and the second port are provided on substantially opposite lateral surfaces of the adapter piece.

13. The connection assembly of claim 1, wherein at least one of the first sensor connection and the second sensor connection comprises at least two electrical conductors for data transmission.

14. The connection assembly of claim 13, wherein at least one of the first sensor connection and the second sensor connection further comprises two electrical conductors for power transmission.

15. A sensor assembly, comprising:
   a dual output subsea sensor; and
   the connection assembly of claim 1, wherein the connection assembly is mounted to the subsea sensor.

16. The sensor assembly of claim 15, wherein the dual output subsea sensor comprises at least one of
   at least two pressure sensing elements and
   at least two temperature sensing elements, an output of the respective at least one of the at least two pressure sensing elements and the at least two temperature sensing elements being communicated on the first and second sensor connections.

17. The connection assembly of claim 1, wherein the connection assembly further comprises a first connection adapter, mounted to the first port or mounted to the adapter piece, to provide the connection to the first subsea cable.

18. The connection assembly of claim 17, wherein the connection adapter includes a mechanical interface to provide the connection to an MKII fitting of the corresponding first or second subsea cable.

19. The connection assembly of claim 17, wherein the first connection adapter is sealed to the first port via at least two O-ring seals.

20. The connection assembly of claim 1, wherein the adapter piece is further configured to maintain an interior pressure below a threshold pressure, when deployed in a subsea environment.

21. The connection assembly of claim 20, wherein the adapter piece is further configured to maintain the interior pressure below the threshold pressure of 5 bar when deployed in a subsea environment.

22. The connection assembly of claim 21, wherein the adapter piece is further configured to maintain the interior pressure below the threshold pressure of 1.5 bar when deployed in a subsea environment.

23. The connection assembly of claim 1, wherein the connection assembly further comprises a second connection adapter, mounted to the second port or mounted to the adapter piece, to provide the connection to the second subsea cable.

24. The connection assembly of claim 23, wherein the second connection adapter is sealed to the second port via at least two O-ring seals.

25. The connection assembly of claim 23, wherein the connection adapter includes a mechanical interface to provide the connection to an MKII fitting of the corresponding first or second subsea cable.

26. A subsea cable harness, comprising:
a first subsea cable including electrical conductors, to provide a first sensor connection;
a second subsea cable including electrical conductors, to provide a second sensor connection; and
the connection assembly according of claim 1,
wherein the first subsea cable is connected to the first port of the connection assembly, and wherein the second subsea cable is connected to the second port of the connection assembly,
wherein the first penetrator is configured to lead electrical conductors of the first sensor connection through the first port into the interior space of the adapter piece, and
wherein the second penetrator is configured to lead electrical conductors of the second sensor connection through the second port into the interior space of the adapter piece.

27. The subsea cable harness of claim 26, further comprising a sensor assembly, comprising:
a dual output subsea sensor; and
the connection assembly, wherein the connection assembly is mounted to the subsea sensor.

28. The subsea cable harness of claim 26, wherein each of the first subsea cable and the second subsea cable is an oil-filled hose.

29. The subsea cable harness of claim 26, wherein at least one of the first subsea cable and the second subsea cable is an oil-filled hose.

30. The subsea cable harness of claim 29, further comprising a sensor assembly, comprising:
a dual output subsea sensor; and
the connection assembly, wherein the connection assembly is mounted to the subsea sensor.

* * * * *